(12) United States Patent
Rondon et al.

(10) Patent No.: US 10,515,905 B1
(45) Date of Patent: Dec. 24, 2019

(54) SEMICONDUCTOR DEVICE WITH ANTI-DEFLECTION LAYERS

(71) Applicant: Raytheon Company, Waltham, MA (US)

(72) Inventors: Michael J. Rondon, Santa Rosa, CA (US); Andrew P. Clarke, Santa Barbara, CA (US); George Grama, Orcutt, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/010,571

(22) Filed: Jun. 18, 2018

(51) Int. Cl.
*H01L 23/58* (2006.01)
*H01L 23/00* (2006.01)
*H01L 21/02* (2006.01)

(52) U.S. Cl.
CPC ........ *H01L 23/562* (2013.01); *H01L 21/0214* (2013.01); *H01L 21/0217* (2013.01); *H01L 21/02164* (2013.01)

(58) Field of Classification Search
CPC ........... H01L 21/02164; H01L 21/0217; H01L 21/0214; H01L 23/562
USPC ........................................................ 257/639
See application file for complete search history.

(56) References Cited

U.S. PATENT DOCUMENTS

| | | | |
|---|---|---|---|
| 5,442,223 A | 8/1995 | Fujii | |
| 5,592,004 A | 1/1997 | Tamura et al. | |
| 7,115,954 B2 | 10/2006 | Shimizu et al. | |
| 7,834,399 B2* | 11/2010 | Kanarsky | H01L 21/82341 257/351 |
| 7,982,250 B2* | 7/2011 | Yamazaki | H01L 21/8221 257/278 |
| 8,415,228 B2* | 4/2013 | Hanaoka | H01L 21/76254 257/347 |
| 2002/0047169 A1 | 4/2002 | Kunikiyo | |

(Continued)

FOREIGN PATENT DOCUMENTS

| | | |
|---|---|---|
| CN | 107611012 | 1/2018 |
| TW | 518759 | 1/2003 |
| WO | 2012047697 | 4/2012 |

OTHER PUBLICATIONS

International Search Report and Written Opinion for corresponding International Application No. PCT/US2019/030856 dated Aug. 5, 2019.

*Primary Examiner* — Luan C Thai
(74) *Attorney, Agent, or Firm* — Renner, Otto, Boisselle & Sklar, LLP

(57) ABSTRACT

A semiconductor device has a substrate with both compressive and tensile layers deposited overlying a single major surface (face) of the device. The tensile layer may be deposited directly on the substrate of the device, with the compressive layer overlying the tensile layer. A transition material may be located between the tensile layer and the compressive layer. The transition material may be a compound including the components of one or both of the tensile layer and the compressive layer. In a specific embodiment, the tensile material may be a silicon nitride, the compressive layer may be a silicon oxide, and the transition material may be a silicon oxy-nitride, which may be formed by oxidizing the surface of the tensile silicon nitride layer. By depositing both tensile and compressive layers on the same face of the device the opposite major surface (face) is free for processing.

21 Claims, 1 Drawing Sheet

(56) References Cited

U.S. PATENT DOCUMENTS

2003/0060058 A1     3/2003   Roy et al.
2007/0259533 A1   11/2007   Ahn et al.
2009/0159958 A1     6/2009   Jones et al.
2009/0246973 A1   10/2009   Clark et al.
2010/0130024 A1     5/2010   Takasawa et al.

\* cited by examiner

SEMICONDUCTOR DEVICE WITH ANTI-DEFLECTION LAYERS

FIELD OF THE INVENTION

The invention is in the field of semiconductor devices, with mechanisms to prevent deflection.

DESCRIPTION OF THE RELATED ART

In semiconductor devices it is desirable to keep the device from bowing. One approach to prevent bowing has been to deposit material on both opposite sides (major surfaces) of a semiconductor wafer. For example depositing compressive stress material on both front and back major surfaces balances stresses, preventing bowing. However it is not always desirable or practical to deposit material on both major surfaces.

SUMMARY OF THE INVENTION

A semiconductor device has a neutral deflection dual layer on a face of a substrate, with a tensile layer and a compressive layer.

A semiconductor device has a silicon nitride tensile layer on a face of a substrate, with a silicon oxide compressive layer on an oxidized surface of the silicon nitride layer.

According to an aspect of the invention, a semiconductor device includes: a substrate; a tensile layer overlying a major surface of the substrate; and a compressive layer overlying the major surface. The tensile layer and the compressive layer both impart forces onto the substrate, to thereby keep the substrate from bowing.

According to an embodiment of any paragraph(s) of this summary, the device includes an intermediate layer between the tensile layer and the compressive layer.

According to an embodiment of any paragraph(s) of this summary, the intermediate layer transmits stresses between the tensile layer and the compressive layer.

According to an embodiment of any paragraph(s) of this summary, the intermediate layer is thinner than the compressive layer and the tensile layer.

According to an embodiment of any paragraph(s) of this summary, the intermediate layer is an oxidized surface of the compressive layer or the tensile layer.

According to an embodiment of any paragraph(s) of this summary, the tensile layer is closer than the compressive layer to the substrate.

According to an embodiment of any paragraph(s) of this summary, the tensile layer is a silicon nitride layer.

According to an embodiment of any paragraph(s) of this summary, the compressive layer is a silicon oxide layer.

According to an embodiment of any paragraph(s) of this summary, the intermediate layer is a silicon oxy-nitride layer.

According to an embodiment of any paragraph(s) of this summary, a tensile force of the tensile layer balances out a compressive force of the compressive layer.

According to another aspect of the invention, a method of making a semiconductor device includes the steps of: depositing a tensile layer overlying a major face of a substrate of the device; and depositing a compressive layer overlying the major face. The tensile layer and the compressive layer both impart forces onto the substrate, to thereby keep the substrate from bowing.

According to an embodiment of any paragraph(s) of this summary, depositing the tensile layer occurs before the depositing the compressive layer, with the compressive layer deposited overlying the tensile layer.

According to an embodiment of any paragraph(s) of this summary, the method includes forming an intermediate layer that is between the tensile layer and the compressive layer.

According to an embodiment of any paragraph(s) of this summary, the intermediate layer is formed after the depositing of the tensile layer, and before the depositing of the compressive layer.

According to an embodiment of any paragraph(s) of this summary, the intermediate layer is formed by oxidizing a surface of the tensile layer.

According to an embodiment of any paragraph(s) of this summary, depositing the tensile layer includes depositing silicon nitride.

According to an embodiment of any paragraph(s) of this summary, depositing the silicon nitride includes depositing the silicon nitride by physical vapor deposition.

According to an embodiment of any paragraph(s) of this summary, depositing the silicon nitride includes columnar deposition of the silicon nitride.

According to an embodiment of any paragraph(s) of this summary, forming the intermediate layer includes oxidizing a surface of the silicon nitride, to form silicon oxy-nitride.

According to an embodiment of any paragraph(s) of this summary, oxidizing includes exposing the surface of the silicon nitride to air.

According to an embodiment of any paragraph(s) of this summary, depositing the compressive layer includes depositing silicon oxide on the silicon oxy-nitride.

According to an embodiment of any paragraph(s) of this summary, depositing the silicon oxide includes depositing the silicon oxide by physical vapor deposition.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

The annexed drawings show various aspects of the invention.

DETAILED DESCRIPTION

A semiconductor device has a substrate with both compressive and tensile layers deposited overlying a single major surface (front face) of the device. The tensile layer may be deposited directly on the substrate of the device, with the compressive layer overlying the tensile layer. A transition material (intermediate layer) may be located between the tensile layer and the compressive layer. The transition material may be a compound including the components of one or both of the tensile layer and the compressive layer. In a specific embodiment, the tensile material may be a silicon nitride, the compressive layer may be a silicon oxide, and the transition material may be a silicon oxy-nitride, which may be formed by oxidizing the surface of the tensile silicon nitride layer. The materials may be deposited using physical vapor deposition. Conditions for the vapor deposition may be controlled to achieve desired growth rates and/or characteristics of the tensile and compressive layers. By depositing both tensile and compressive layers on the same face of the device the opposite major surface (face) is free for processing.

Figure 1:
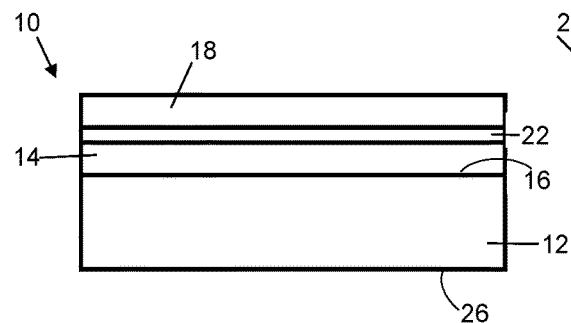
FIG. 1 is a side cross-sectional view of a semiconductor device in accordance with an embodiment of the present invention.

FIG. 1 shows a semiconductor device 10 that includes a substrate 12, with a tensile layer 14 overlying a major surface (front face) 16 of the substrate 12, and a compressive layer 18 overlying both the tensile layer 14 and the front face 16. There may also be an intermediate layer (or transition layer) 22 between the tensile layer 14 and the compressive layer 16. As explained in greater detail below, the intermediate layer 22 transmits stresses from the compressive layer 18 through to the tensile layer 14 and the substrate 12. The intermediate layer 22 may be a compound that includes one or more components also in the tensile layer 14 and/or the compressive layer 16. Alternatively the intermediate layer 22 may be formed by chemical compounding of a surface of the tensile layer 14, for example by forming an oxide layer on the surface of the tensile layer 14.

The intermediate layer 22 may be used to facilitate deposition of the compressive layer 18 overlying the tensile layer 14. The intermediate layer 22 may make for a more consistent device 10 in its performance in terms of being able to prevent bowing of the substrate 12. Toward that end, the intermediate layer 22 may facilitate consistency in the stresses and/or in the transmission of stresses from the compressive layer 18 to the tensile layer 14. However these possibilities are not definitive or exhaustive, and the intermediate layer 22 may provide different or additional benefits to the device 10.

Formation of the tensile layer 14 and the compressive layer 18 both overlying the front face 16 allows operations to be performed on a back face (major surface) 26 of the substrate 12. For example it may be possible to reduce thickness of the device 10 as needed by removing material along the back face 26. Or it may be important to keep the back side 26 available for other purposes, such as for placement of sensitive devices (components), or for bonding to other structures for stacking of wafers or semiconductor devices.

In one embodiment the tensile layer 14 is a silicon nitride, the compressive layer 18 is a silicon oxide, and the intermediate layer 22 is a silicon oxy-nitride. These are only example materials, and other suitable materials are possible as alternatives. The layers may be formed with compositions and thicknesses so as to put a desired stress on the substrate 12, to keep the substrate 12 from bowing.

The silicon nitride tensile layer 14 may have a thickness from 0.1 μm to 1 μm, for example having a thickness of 0.6±0.02 μm. The silicon oxide compressive layer 18 may have a thickness of less than 1 μm, such as 0.5±0.02 μm. The silicon oxy-nitride intermediate layer 22 may have a thickness of about 200 Å (200 Angstroms), such as 200±50 Å (200±50 Angstroms). These values are examples, and should not be construed as limitations. For example a wide varieties of other layer thicknesses may be used, such as while maintaining the general ratios in the thicknesses of the layer. For instance, keeping the ratio of silicon nitride to silicon oxide thicknesses at 6:5 will keep the bow close to zero for thin films on the order of 0.1-10 μm.

As an alternative stoichiometric tantalum nitride and tantalum may be used, with an intermediate transition layer of sub-stoichiometric tantalum nitride. The tantalum nitride is compressive, the tantalum in tensile, and the sub-stoichiometric tantalum nitride allows the tantalum to grow with tensile stress. Another alternative possibility is using a bilayer of tantalum nitride and copper, with an intermediate layer of tantalum oxy-nitride, which may be created by exposing the tantalum nitride film to atmosphere to oxidize.

Figure 2:
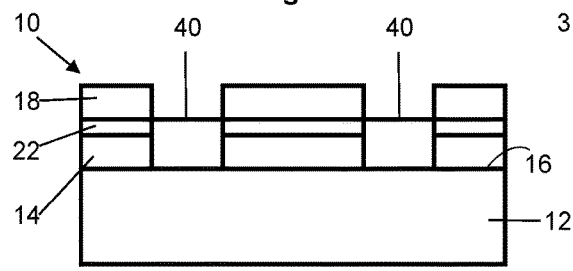
FIG. 2 is a side cross-sectional view of the semiconductor device of FIG. 1, with additional components installed.

FIG. 2 shows a view of the device 10 at a later stage in processing, when electronic components 40 have been placed on the front face 16, for example engaging conductive traces and/or vias on the substrate 12. Parts of the layers 14, 18, and 22 may be removed, such as by selective etching, in order to form or place the components 40 on the substrate 12. In other embodiments, the layers 14, 18, and 22 may be deposited onto or around existing components and structures. It will be appreciated that the layers 14, 18, and 22 may be removed only at certain discrete locations, leaving the remaining parts of the layers 14, 18, and 22 as continuous layers that overly large portions of the front face 16.

It is often desirable for the electronic components 40 to be electrically isolated from one another. Therefore it is desirable for the materials used in the layers 14, 18, and 22 to be dielectrics (electrically insulating). The silicon oxide, silicon nitride, and silicon oxy-nitride materials used in one embodiment of the invention satisfy this condition. In addition silicon nitride has the characteristic of strongly adhering to most substrates used for electronic devices.

The device 10 may initially have a wafer for its substrate, with the wafer being subdivided into individual devices. The individual devices may be used in any of a wide variety of products, and may have any of a variety of components, such as conductive traces, switches, capacitors, etc. Devices such as the device 10 may be stacked as a part of a larger electronic device, for 3D wafer stacking, for example.

Figure 3:
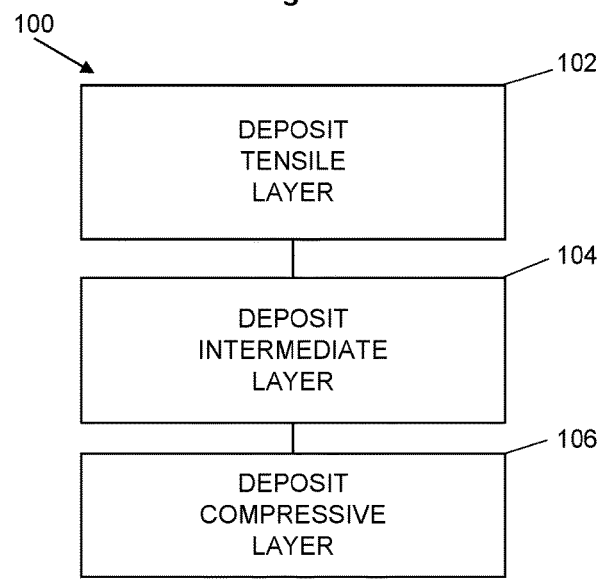
FIG. 3 is a high-level flow chart of a method of making a semiconductor device, according to an embodiment of the invention.

With reference now to FIG. 3, steps are shown for a method 100 for producing the device 10 (FIG. 1). The steps shown in FIG. 3 and described below are only a few of the steps used in forming a final device, with the illustrated steps focused on the process of preventing bowing or other deflection.

In step 102 the tensile layer 14 (FIG. 1) is deposited overlying a major surface (front face) 16 of the substrate 12. The deposition may be by physical vapor deposition (PVD), which is a different process than the plasma enhanced chemical vapor deposition (PECVD) that is usually used for depositing this material. Advantages for PVD include facilitating cassette wafer processing, providing a shorter cycle time and higher throughput, a low material consumption rate, and low contamination risk.

The PVD process is performed in a sealed chamber, with the gaseous source materials in a pressure-controlled atmosphere. It has been found that as the chamber pressure increases the tensile film stress of the deposited layer (the tensile layer 14 (FIG. 1)) increases, but the deposition rate drops. Thus some sort of balance needs to be struck between a desirable tensile stress for the deposited material, and a faster rate of deposition. Additionally the chamber pressure may be selected so as to yield a deposited material that has a similar magnitude of stress as the material of the compressive layer 18 (FIG. 1), so as to minimize (or reduce) the amount of the tensile material that needs to be deposited. A smaller amount of deposition is preferable because it makes the deposition process proceed faster and at lower cost. In addition, it is possible for deposited silicon nitride to be either compressive or tensile, depending on how it is deposited. For the tensile layer 14 of course tensile silicon nitride is desired.

The chamber pressure for the PVD process in step 102 may be about 3 mTorr, for example being 3.1±0.1 mTorr, to give non-limiting example values. The primary source for the chamber pressure may be an inert gas, such as argon. The flow of nitrogen gas may be controlled to prevent poisoning, where material on the target used for deposition accumulates faster than the sputtering process occurs. Temperature in the chamber may be controlled, and/or the processing time may be controlled, to prevent damage to a target for sputtering, and/or to avoid deleterious effects to the substrate (wafer) 12 and/or to the deposited material.

Increasing of the pressure in the chamber leads to growth of silicon nitride in columnar structures, which produces a more porous and tensile film. The spacing between columnar grains produces a lower refractive index that the typical stoichiometric silicon nitride ($Si_3N_4$), although the porous columnar form that may be used for the tensile layer 14 may also have the same stoichiometric silicon nitride.

It has been found that silicon nitride yields a wafer bow of −49 μm for every 1 μm of thickness of the tensile layer 14, to give a single non-limiting example value. The thickness of the layers 14 and 18 may be selected balance out tension and compression forces on the substrate 12.

In step 104 the intermediate layer 22 (FIG. 1) is formed. The intermediate layer 22 may be formed by oxidizing the top of the tensile layer 14, for example oxidizing the surface of the silicon nitride to form oxy-nitride. This may be done by exposing the silicon nitride to air, for a sufficient time to form oxidize the top layers of the silicon nitride, to produce the intermediate layer 22. This forms a film gradient from the silicon nitride tensile layer 14 to the silicon oxy-nitride of the intermediate layer 22. This forms a solid base for the subsequent formation of the silicon oxide compression layer 18.

Silicon nitride may be oxidized at room temperature and atmospheric pressure to form a surface layer, such as with a thickness of 100±50 Angstroms of silicon oxy-nitride. The top monolayers of silicon nitride oxidize within the first 5-10 minutes of air exposure.

The deposition of silicon oxide directly on the silicon nitride may produce undesirable and/or unpredictable results. The silicon oxide stress is affected by the surface it grows upon. It is believed that when silicon oxide is deposited (grown) directly on silicon nitride, the porous silicon nitride induces columnar growth in the silicon oxide. This may produce a tensile silicon oxide, for example having a bow of −33 μm for every 1 μm deposited, when what is desired is for the silicon oxide to be compressive, to provide a force on the substrate 12 that counteracts the tensile force of the underlying layer 14. However when the silicon nitride surface is oxidized first, the top oxidized monolayers form a compact film surface that allows the silicon oxide form to grow densely, producing a compressive film. For example the silicon oxide may have a wafer bow of +85 μm for every 1 μm of silicon oxide thickness. This allows formation of a compressive layer that counteracts the tensile force from the silicon nitride.

The above mechanisms are conjectures for the observed advantageous performance of devices with the intermediate layer 22. It should be appreciated that the actual mechanisms of material growth may be different from those described above.

Figure 4:
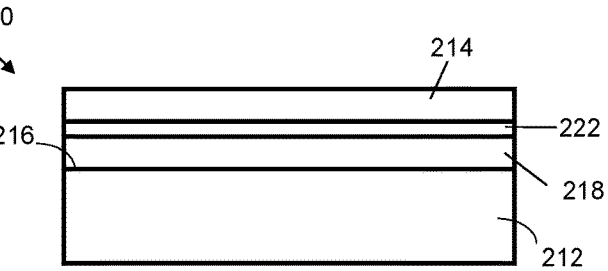
FIG. 4 is a side cross-sectional view of a semiconductor device in accordance with another embodiment of the present invention.

Finally, in step 106 the compressive layer 18 (FIG. 1) is deposited overlying the tensile layer 14. More specifically, the intermediate layer 22 may be used to facilitate deposition of the compressive layer 18 overlying the tensile layer 14. The compressive layer 18 may be deposited by a PVD or other suitable deposition or formation process. When using PVD, compressive films form at low pressures on the order of 0.1-2 mTorr. For example, to balance the deflection from a tensile silicon nitride film deposited at 3 mTorr, a comprehensive silicon dioxide film may be deposited at 0.6 mTorr. Compressive dielectric films, for example silicon oxide and silicon nitride, may alternatively be deposited using electron beam evaporation. Other material sets of compressive films, typically metals, may be deposited using electroplating. FIG. 4 shows an alternative arrangement of a semiconductor device 210 that has a compressive layer 218 overlying a front face 216 of a substrate 212. A tensile layer 214 overlies the compressive layer 218, with an intermediate layer 222 between the layers 214 and 218. The device 210 may function similarly to the device 10 (FIG. 1) with regard to resisting bowing or deformation. Certain materials sets, for example tantalum nitride and copper, allow for the compressive film to be deposited first (tantalum nitride) and the tensile film to be deposited on top (copper). In some cases, an intermediate layer of tantalum may be used between the tantalum nitride and copper layers to promote copper adhesion.

Figure 5:
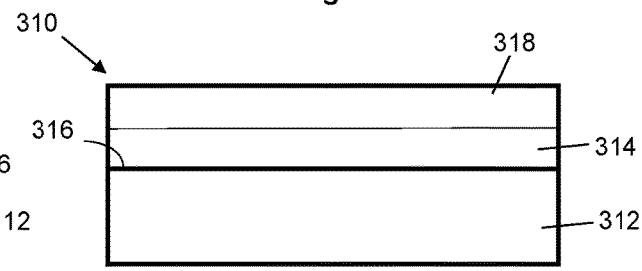
FIG. 5 is a side cross-sectional view of a semiconductor device in accordance with yet another embodiment of the present invention.

FIG. 5 shows another alternative of a semiconductor device 310 that has a tensile layer 314 on a front face 316 of a substrate 312, and a compressive layer 318 is formed directly on the tensile layer 314. The intervening layer 22 (FIG. 1) is omitted in this embodiment. Although an intermediate layer has advantages, as described above, it may be possible to omit the intermediate layer in some situations, such as with certain materials. As an example, tensile copper may be deposited directly onto compressive tantalum nitride to form a balanced film stack. The two films have complimentary deflections that can cancel out without the aid of an intermediate film.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A semiconductor device comprising:
   a substrate;
   a tensile layer overlying a major surface of the substrate;
   a compressive layer overlying the major surface; and
   an intermediate layer between the tensile layer and the compressive layer, and in contact with both the tensile layer and the compressive layer;
   wherein the tensile layer and the compressive layer both impart forces onto the substrate, to thereby keep the substrate from bowing.

2. The semiconductor device of claim 1, wherein the intermediate layer is thinner than the compressive layer and the tensile layer.

3. The semiconductor device of claim 1, wherein the intermediate layer is an oxidized surface of the compressive layer or the tensile layer.

4. The semiconductor device of claim 1, wherein the tensile layer is closer than the compressive layer to the substrate.

5. The semiconductor device of claim 1,
   wherein the tensile layer is a silicon nitride layer; and
   wherein the compressive layer is a silicon oxide layer.

6. The semiconductor device of claim 5,
   wherein the intermediate layer is a silicon oxy-nitride layer.

7. The semiconductor device of claim 1, wherein a tensile force of the tensile layer balances out a compressive force of the compressive layer.

8. A method of making a semiconductor device, the method comprising:
   depositing a tensile layer overlying a major face of a substrate of the device; and
   depositing a compressive layer overlying the major face;
   wherein the tensile layer and the compressive layer both impart forces onto the substrate, to thereby keep the substrate from bowing; and
   wherein the depositing of the tensile layer or the depositing of the compressive layer includes depositing directly on the major surface of the substrate.

9. The method of claim 8, wherein depositing the tensile layer occurs before the depositing the compressive layer, with the compressive layer deposited overlying the tensile layer.

10. The method of claim 8, further comprising forming an intermediate layer that is between the tensile layer and the compressive layer, wherein after the depositing of the tensile layer and the depositing of the compressive layer the intermediate layer is in contact with both the tensile layer and the compressive layer.

11. The method of claim 10, wherein the intermediate layer is formed after the depositing of the tensile layer, and before the depositing of the compressive layer.

12. The method of claim 11, wherein the intermediate layer is formed by oxidizing a surface of the tensile layer.

13. The method of claim 8, wherein depositing the tensile layer includes depositing silicon nitride.

14. The method of claim 13, wherein depositing the silicon nitride includes depositing the silicon nitride by physical vapor deposition.

15. The method of claim 13, wherein depositing the silicon nitride includes columnar deposition of the silicon nitride.

16. The method of claim 13, wherein forming the intermediate layer includes oxidizing a surface of the silicon nitride, to form silicon oxy-nitride.

17. The method of claim 16, wherein oxidizing includes exposing the surface of the silicon nitride to air.

18. The method of claim 16, wherein depositing the compressive layer includes depositing silicon oxide on the silicon oxy-nitride.

19. The method of claim 18, wherein depositing the silicon oxide includes depositing the silicon oxide by physical vapor deposition.

20. The semiconductor device of claim 1, wherein the tensile layer or the compressive layer is in contact with the major surface of the substrate.

21. The semiconductor device of claim 1, wherein the tensile layer, the intermediate layer, and the compressive layer together form a neutral deflection layer overlying the substrate and in contact with the major surface of the substrate.

* * * * *